(12) United States Patent
Aravind et al.

(10) Patent No.: US 8,874,633 B2
(45) Date of Patent: Oct. 28, 2014

(54) DETERMINING COEFFICIENTS FOR DIGITAL LOW PASS FILTER GIVEN CUTOFF AND BOOST VALUES FOR CORRESPONDING ANALOG VERSION

(75) Inventors: Nayak Ratnakar Aravind, Allentown, PA (US); Erich F. Haratsch, Bethlehem, PA (US)

(73) Assignee: LSI Corporation, San Jose, CA (US)

( * ) Notice: Subject to any disclaimer, the term of this patent is extended or adjusted under 35 U.S.C. 154(b) by 648 days.

(21) Appl. No.: 13/215,810

(22) Filed: Aug. 23, 2011

(65) Prior Publication Data
US 2013/0054663 A1    Feb. 28, 2013

(51) Int. Cl.
*G06F 17/10* (2006.01)
*H03H 17/02* (2006.01)
*H03H 17/04* (2006.01)
*H03H 17/06* (2006.01)
*G11B 20/10* (2006.01)

(52) U.S. Cl.
CPC .......... *H03H 17/0294* (2013.01); *H03H 17/04* (2013.01); *H03H 17/0685* (2013.01); *G11B 20/10046* (2013.01); *G11B 20/10018* (2013.01); *G11B 20/10027* (2013.01); *G11B 2220/2508* (2013.01)
USPC ....................................................... 708/300

(58) Field of Classification Search
CPC ... H03H 17/06; H03H 17/0294; H03H 17/02; H03H 17/04; H03H 17/0223
USPC ................................................... 708/300–323
See application file for complete search history.

(56) References Cited

U.S. PATENT DOCUMENTS

| | | | | |
|---|---|---|---|---|
| 5,493,454 A | * | 2/1996 | Ziperovich et al. | 360/45 |
| 6,003,051 A | * | 12/1999 | Okazaki | 708/300 |
| 2003/0198165 A1 | * | 10/2003 | Mouri et al. | 369/53.35 |
| 2004/0114912 A1 | * | 6/2004 | Okamoto et al. | 386/114 |

* cited by examiner

*Primary Examiner* — Tan V. Mai
(74) *Attorney, Agent, or Firm* — Hamilton DeSanctis & Cha

(57) ABSTRACT

Methods and apparatus are provided for determining coefficients for a digital low pass filter, given cutoff and boost values for a corresponding analog version of the digital low pass filter. Coefficients are determined for a digital low pass filter by obtaining cutoff and boost values for a corresponding analog version of the digital low pass filter; and determining the coefficients for the digital low pass filter based on the obtained cutoff and boost values. The coefficients can be determined, for example, by generating a transfer function, H(s), for the corresponding analog version using the obtained cutoff and boost values: transforming the transfer function, H(s), to a frequency domain characterization, H(z), using one or more bilinear transforms to obtain a plurality of coefficients for an infinite impulse response (IIR) filter; generating the IIR filter using the plurality of coefficients for the IIR filter; and applying an impulse to the IIR filter to obtain the one or more coefficients for the digital low pass filter. In another variation, the coefficients are pre-computed and obtained from a look-up table.

29 Claims, 12 Drawing Sheets

$$H(s) \Rightarrow \boxed{s = \frac{2}{T_d}\left(\frac{1-z^{-1}}{1+z^{-1}}\right)} \Rightarrow H(z)$$

300

DETERMINING COEFFICIENTS FOR DIGITAL LOW PASS FILTER GIVEN CUTOFF AND BOOST VALUES FOR CORRESPONDING ANALOG VERSION

CROSS-REFERENCE TO RELATED APPLICATIONS

The present invention is related to United States Patent Application entitled "Read Channel With Oversampled Analog to Digital Conversion," United States Patent Application entitled "Read Channel With Selective Oversampled Analog to Digital Conversion," and United States Patent Application entitled "Read Channel With Oversampled Analog to Digital Conversion and Parallel Data Detectors," each filed contemporaneously herewith and incorporated by reference herein.

FIELD OF THE INVENTION

The present invention relates generally to read channels and, more particularly, to techniques for determining one or more coefficients for a digital low pass filter that may be used, for example, in such read channels.

BACKGROUND OF THE INVENTION

A magnetic recording read channel converts an analog read signal into an estimate of the user data that was recorded on a magnetic medium. Read heads and magnetic media introduce noise and other distortions into the read signal. For example, as the information densities in magnetic recording increase, the intersymbol interference (ISI) becomes more severe (i.e., the channel impulse response becomes longer). ISI is a form of signal distortion in which one symbol interferes with one or more other symbols.

In a conventional read channel, a continuous-time filter (CTF) typically processes the read signal in the analog domain to perform anti-alias filtering, band-limit filtering to reduce electronic noise, and signal shape filtering to reduce ISI. Generally, anti-alias filtering removes noise and residual signal components above the Nyquist frequency (equal to half the baud rate frequency) to avoid aliasing. An analog-to-digital converter (ADC) typically processes the CTF output to generate digital samples for further processing in the digital domain. A Viterbi detector is often used in a read channel to process the digital samples and detect the recorded data bits in the presence of intersymbol interference and other noise.

As process technology gets smaller and data rates increase, it becomes increasingly challenging to build analog circuits, such as the CTF filters, that meet the demanding performance specifications of read channels. A need therefore exists for improved read channels that transfer a portion of the signal processing burden from the analog domain to the digital domain, to thereby simplify the analog circuitry design.

In such an environment, a digital low pass filter may be required to perform filter functions in the digital domain that were previously performed in the analog domain. A need exists for digital low pass filters that can be programmed using fewer degrees of freedom. A further need exists for digital low pass filters that provide several taps, and support a wide range of values for each tap coefficient. Yet another need exists for improved techniques for generating the desired filter coefficients.

SUMMARY OF THE INVENTION

Generally, methods and apparatus are provided for determining coefficients for a digital low pass filter given cutoff and boost values for a corresponding analog version of the digital low pass filter. According to one aspect of the invention, coefficients are determined for a digital low pass filter by obtaining cutoff and boost values for a corresponding analog version of the digital low pass filter; and determining the coefficients for the digital low pass filter based on the obtained cutoff and boost values.

In one exemplary embodiment, the coefficients are determined by generating a transfer function, H(s), for the corresponding analog version using the obtained cutoff and boost values: transforming the transfer function, H(s), to a frequency domain characterization, H(z), using one or more bilinear transforms to obtain a plurality of coefficients for an infinite impulse response (IIR) filter; generating the IIR filter using the plurality of coefficients for the IIR filter; and applying an impulse to the IIR filter to obtain the one or more coefficients for the digital low pass filter. In another implementation, the coefficients are pre-computed and obtained from a look-up table.

In one preferred embodiment, the number of obtained coefficients for the digital low pass filter are truncated to a maximum value. The IIR filter optionally comprises a plurality of stages. The digital low pass filter can be employed to perform one or more filter functions in a digital domain that were previously performed in an analog domain by the corresponding analog version of the digital low pass filter. For example, the digital low pass filter can be employed in a read channel and the digital low pass filter can perform functions previously performed by a continuous time filter in the read channel.

A more complete understanding of the present invention, as well as further features and advantages of the present invention, will be obtained by reference to the following detailed description and drawings.

DETAILED DESCRIPTION

The present invention provides improved techniques for determining coefficients for a digital low pass filter given cutoff and boost values for a corresponding analog version of the digital low pass filter. While the present invention is illustrated in the exemplary context of digital low pass filters employed in a read channel, the present invention can be employed to determine coefficients for any digital low pass filters, as would be apparent to a person of ordinary skill in the art. In the exemplary embodiment, the disclosed techniques are employed in an exemplary read channel that employs an oversampled ADC that generates a plurality of digital samples per bit period. In this manner, the CTF circuit can be simplified by transferring at least a portion of the equalization process to the digital domain. The oversampled ADC allows a portion of the filtering to be performed in the analog domain and a portion of the filtering to be performed in the digital domain. For example, band limit filtering to reduce out-of-band noise and pulse shape filtering to compensate for intersymbol interference can now be performed in the digital domain.

Figure 1:
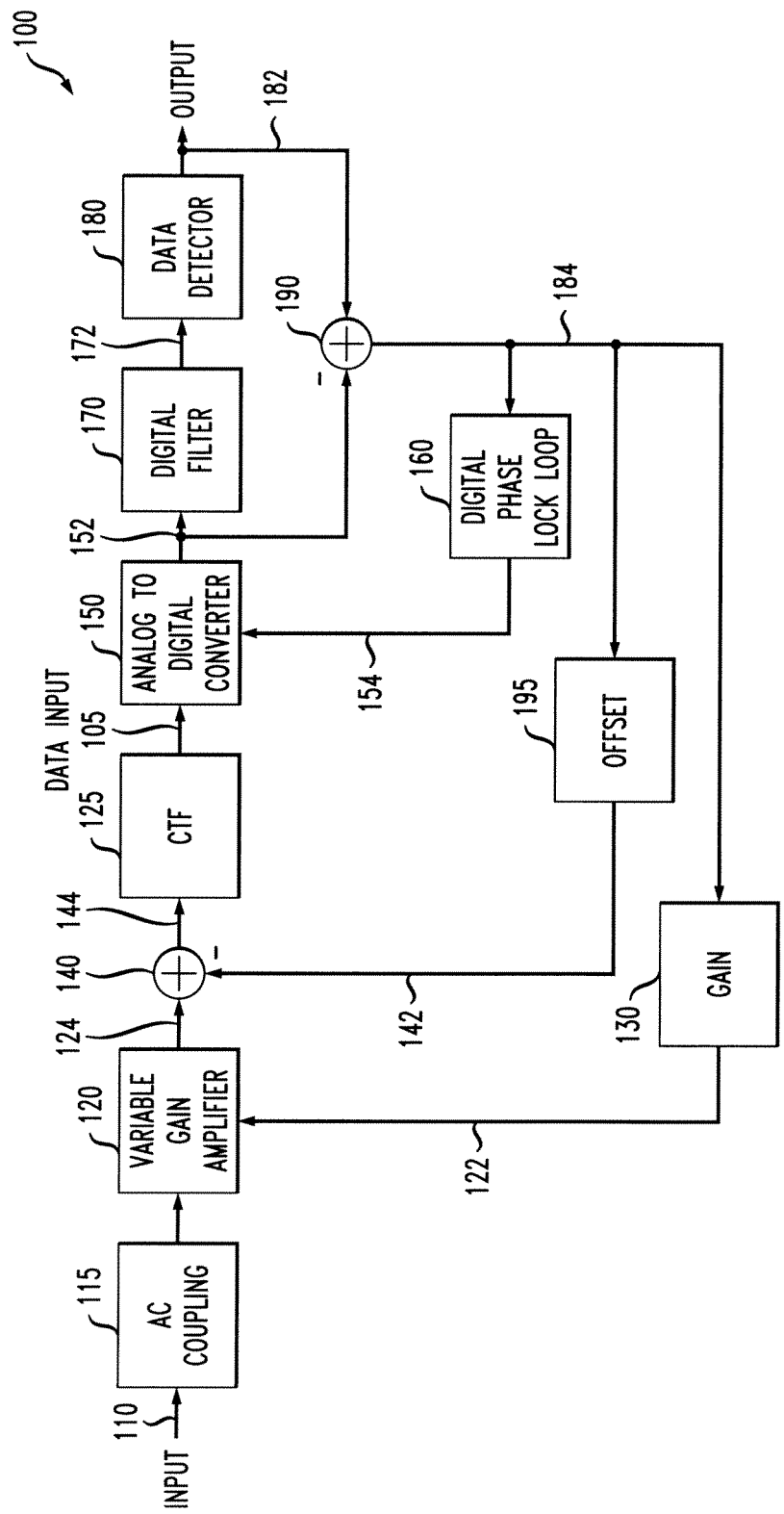
FIG. 1 illustrates an exemplary conventional data detection system including various feedback loops.

FIG. 1 illustrates an exemplary, conventional data detection system 100 including various feedback loops. Data detection system 100 includes an analog front end (AFE) that receives an analog input signal 110 via AC coupling 115. For example, where input signal 110 is a magnetic signal sensed from a magnetic storage medium, AC coupling 115 may include circuitry capable of converting a sensed magnetic field to a corresponding analog electrical signal.

The output of AC coupling 115 is amplified using a variable gain amplifier 120. The gain applied by variable gain amplifier 120 is governed by a gain feedback value 122 that is provided by a gain calculation circuit 130. Gain calculation circuit 130 may be any circuit known in the art that is capable of providing a variable gain output based on an input error signal.

The amplified input 124 is summed with an offset value 142 using a summation element 140. Offset value 142 is provided by an offset circuit 195. The sum 144 is provided to a continuous time filter (CTF) 125 that operates to filter undesirable noise from the received analog signal, as discussed above. Continuous time filter 125 provides a data input 105 that is representative of analog input signal 110. Continuous time filter 125 may be any filter known in the art that is capable of reducing or eliminating noise from a received analog signal. For example, continuous time filter 125 may be a low pass filter capable of reducing or eliminating high frequency noise from a signal. A variety of filters and filter architectures may be used in accordance with different embodiments of the invention, as would be apparent to a person of ordinary skill in the art.

Data input 105 is provided to an analog to digital converter (ADC) 150 that converts the continuous analog signal into a series of corresponding digital samples 152. Digital samples 152 are obtained in accordance with a clock signal 154 generated based on the received data by a digital phase lock loop circuit 160. Digital samples 152 are provided to a digital filter 170 that provides a filtered output 172 to a data detector 180. Digital filter 170 may be embodied, for example, as a digital finite impulse response filter, as known in the art. Data detector 180 provides an ideal output 182 that is subtracted from the corresponding digital samples 152 using a summation element 190. Data detector 180 may be any known data detector circuit, such as a Viterbi algorithm data detector.

The resulting output of summation element 190 is an error signal 184 that is used to drive digital phase lock loop circuit 160, offset circuit 195 and gain calculation circuit 130.

Exemplary data detection system 100 utilizes three adaptive feedback loops. The first loop includes digital phase lock loop circuit 160 and is operable to adaptively adjust the sampling period used by analog to digital converter 150 to sample data input 105 (i.e., adjusting the phase and/or frequency of clock signal 154). The second loop includes offset circuit 195 that is used to adaptively adjust any DC offset from the received analog input. The third loop includes gain calculation circuit 130 that is used to adaptively adjust the gain used in preprocessing the received analog input signal.

The exemplary conventional data detection system 100 may also include a magneto-resist asymmetric (MRA) correction filter (not shown in FIG. 1), for example, prior to the CTF 125. Generally, magneto-resistive (MR) heads that are used for magnetic recording exhibit non-linear transfer functions. Ideally, the output current(s) from the head is linearly related to the magnetic flux being read (x). However, most heads exhibit quadratic non-linearity, with the result that the output current is expressed as $s=kx+\alpha x^2$, where k is a scaling factor and $\alpha$ controls the level of non-linearity in the head. This phenomenon is referred to as MR asymmetry (MRA) in the head. In a conventional read channel, the analog portion may have an MRA correction (MRAC) block, which approximates the inverse transfer function needed to linearize the head output, as discussed further below in conjunction with FIG. 5A.

As previously indicated, the present invention recognizes that some of the signal processing burden can be transferred from the analog domain (prior to the ADC 150 of FIG. 1) to the digital domain. According to one aspect of the invention, an oversampled ADC generates a plurality of digital samples per bit period. Among other benefits, the oversampled digital samples allow the CTF circuit design to be simplified by transferring at least a portion of the equalization process to the digital domain.

Figure 2A:
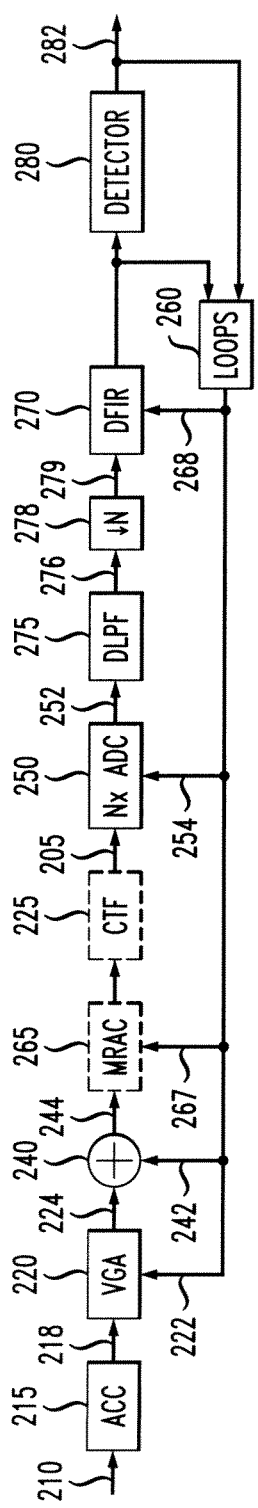
FIG. 2A illustrates an exemplary data detection system incorporating various aspects of the present invention.

FIG. 2A illustrates an exemplary data detection system 200 incorporating various aspects of the present invention. The data detection system 200 includes an analog front end (AFE) that receives an analog input signal 210 via AC coupling 215, in a similar manner to the conventional data detection system 100 of FIG. 1. In addition, the output of AC coupling 215 is amplified using a variable gain amplifier 220, governed by a gain feedback value 222 that is provided by a feedback loop 260, in a similar manner to FIG. 1. The output of the variable gain amplifier 220 is discussed further below in conjunction with FIGS. 2B and 2C. The amplified input 224 is summed with an offset value 242 using a summation element 240. Offset value 242 is provided by a feedback loop 260, in a similar manner to FIG. 1.

As shown in FIG. 2A, the sum 244 is provided to an optional MRA correction filter 265 that approximates the inverse transfer function needed to linearize the output of the read head, as discussed further below in conjunction with FIG. 5A. The output of the MRA correction filter 265 is applied to an optional CTF 225 that may operate to filter undesirable noise from the received analog signal, as discussed above. According to one aspect of the present invention, the CTF 225 is simplified by transferring at least a portion of the equalization process to the digital domain. For example, in one embodiment, CTF 225 performs anti-aliasing filtering, and partial band-limit filtering of electronic noise. The present invention recognizes that additional band-limit filtering of electronic noise, as well as signal shape filtering to reduce ISI can be better performed in the digital domain, as discussed further below in conjunction with FIG. 2F. A suitable transfer function, H(s), for the CTF 225 is provided below in the section entitled "Determining Coefficients for Digital LPF," where the numerator stages indicate the zeros and the denominator indicate the poles.

CTF 225 provides a data input 205 that is representative of analog input signal 210. CTF 225 may be any filter known in the art that is capable of reducing or eliminating noise from a received analog signal. A variety of filters and filter architectures may be used in accordance with different embodiments of the invention, as would be apparent to a person of ordinary skill in the art.

Data input 205 is provided to an oversampled ADC 250 that converts the continuous analog signal 205 into a plurality (N) of corresponding digital samples 252 for each bit interval. For example, the oversampling may generate N=2 or N=4 digital samples 252 for each bit interval. While the present invention is illustrated herein using an exemplary oversampling rate of N=4, any oversampling rate can be employed, as would be apparent to a person of ordinary skill in the art. In general, the oversampling rate may be any integer or fractional multiple that is greater than one (1).

Digital samples 252 are obtained in accordance with a clock signal 254 generated based on the received data, for example, by a digital phase lock loop circuit within loops 260, as discussed above in conjunction with FIG. 1.

The oversampled digital samples 252 are then filtered by a digital low pass filter (DLPF) 275, discussed further below in conjunction with FIGS. 3A through 3C. Generally, the DLPF 275 performs additional band-limit filtering of electronic noise, as well as signal shape filtering to reduce ISI, in accordance with the present invention.

In the exemplary embodiment of FIG. 2A, the filtered output 276 generated by the DLPF 275 is then downsampled to a baud rate by a downsampling circuit 278. As discussed further below in conjunction with FIG. 3C, the DLPF 275 and downsampling circuit 278 can optionally be implemented as a single circuit. The downsampled output 279 generated by the downsampling circuit 278 comprises a single digital sample for each bit interval. The downsampled output 279 is provided to a digital FIR filter 270 (DFIR) that provides a filtered output to a data detector 280, in a similar manner to FIG. 1. Data detector 280, such as a Viterbi algorithm data detector, provides an ideal output 282 that is processed by feedback loops 260. The data detector 280 may be any known data detector circuit. An exemplary data detector 680 is discussed further below in conjunction with FIG. 8.

The feedback loops 260 may comprise, for example, the gain calculation circuit 130, offset circuit 195 and digital phase lock loop circuit 160 of FIG. 1, that generate a gain feedback value 222, an offset value 242 and a clock signal 254, respectively, in a similar manner to FIG. 1.

In addition, the feedback loops 260 generate a feedback value 267 for the MRA correction filter 265, in a known manner, as discussed further below in conjunction with FIG. 5A, and a set of equalizer coefficients 268 for the DFIR filter 270, as discussed further below in conjunction with FIGS. 9A and 9B.

As discussed hereinafter, FIGS. 2B through 2F illustrate various power spectral densities at various points in the exemplary data detection system 200. While electronics and ADC quantization noise are shown as an example, the explanations would apply to power spectral densities for any other noise components that are present at the input to the VGA 218, as would be apparent to a person of ordinary skill in the art.

Figure 2B:
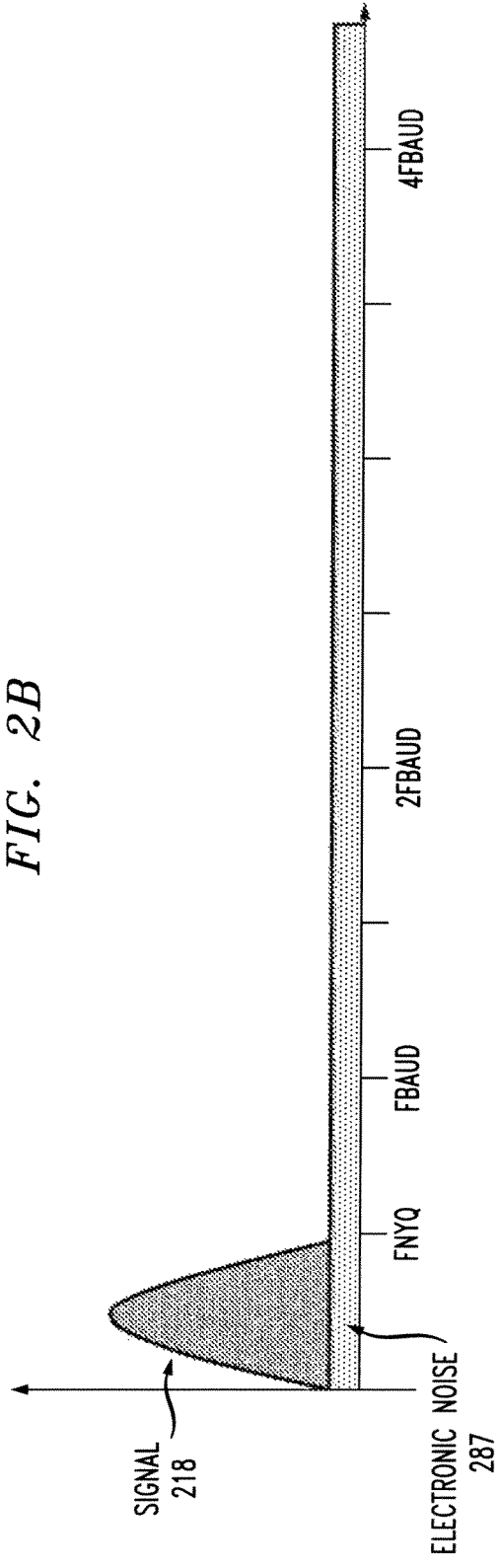
FIG. 2B illustrates the power spectral densities of the signal and noise at the input of the variable gain amplifier of FIG. 2A.

FIG. 2B illustrates the power spectral densities of the signal 218 and noise 287 at the input of the variable gain amplifier 220, where fbaud is the baud-rate frequency and fnyq is the Nyquist frequency (equal to half the baud rate frequency). Without loss of generality, the power spectral densities are idealized in FIG. 2B. Typically, the data-carrying signal 218 will have significant power density components within the Nyquist band from 0 up to the Nyquist frequency, fnyq, while the noise 287 can be present at any frequency. For illustration purposes, electronic noise 287 is shown in FIG. 2B, which is typically white and constant across all frequencies. Real-life signals 218 may also contain noise sources with other frequency characteristics.

The power spectral densities of the signal 224 and noise 287 at the output of the variable gain amplifier 220 would look similar to FIG. 2B, if the variable gain amplifier does not perform signal shaping or band limit filtering (i.e., if the variable gain amplifier 220 has high bandwidth).

Figure 2C:
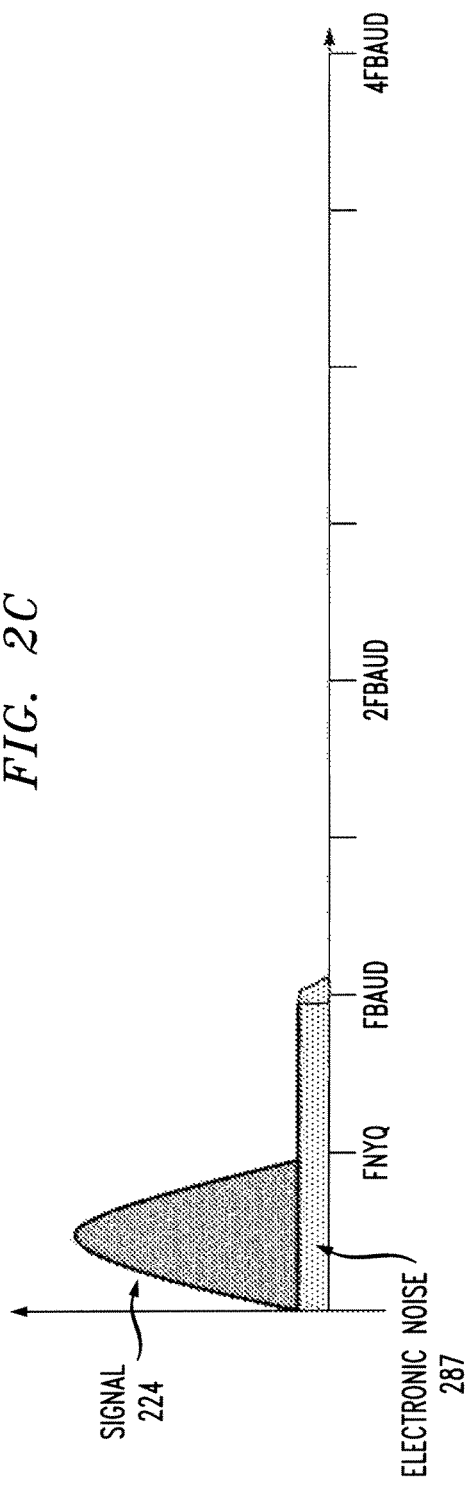
FIG. 2C illustrates the power spectral density of the signal and noise at the output of a limited bandwidth variable gain amplifier of FIG. 2A, as a function of frequency.

FIG. 2C illustrates the power spectral density of the signal 224 and noise 287 at the output of the variable gain amplifier 220 of FIG. 2A, as a function of frequency, where the variable gain amplifier 220 has limited bandwidth. In an exemplary embodiment, the variable gain amplifier 220 has a low pass filter transfer function with a passband covering the frequencies up to about the baud rate frequency, fbaud, and a low pass corner frequency at about the baud rate frequency. In this case, the exemplary variable gain amplifier 220 should maintain the analog signal 224 without distortion up to the baud rate frequency, fbaud, and cut off noise 287 above the baud rate frequency. In an alternative embodiment, the CTF 225 performs the low pass filtering function instead of the variable gain amplifier 220, or the low pass filtering function is distributed between the variable gain amplifier 220 and the CTF 225.

Generally, the low pass corner frequency of this low pass filtering should lie somewhere between the Nyquist frequency and half the oversampling frequency, which is four times the baud rate frequency in the exemplary embodiment. The low pass filter corner frequency should not be above half the oversampling frequency in order to avoid aliasing of signal and noise components at the output of the oversampling ADC 250. It is advantageous to choose a low pass corner frequency above the Nyquist frequency such as at the baud rate frequency in order to reduce the implementation complexity of the analog variable gain amplifier 220 or CTF 225. In this case, the rolloff of the transfer function at the low pass corner frequency does not have to be designed as steep as in a conventional baud rate system.

Figure 2D:
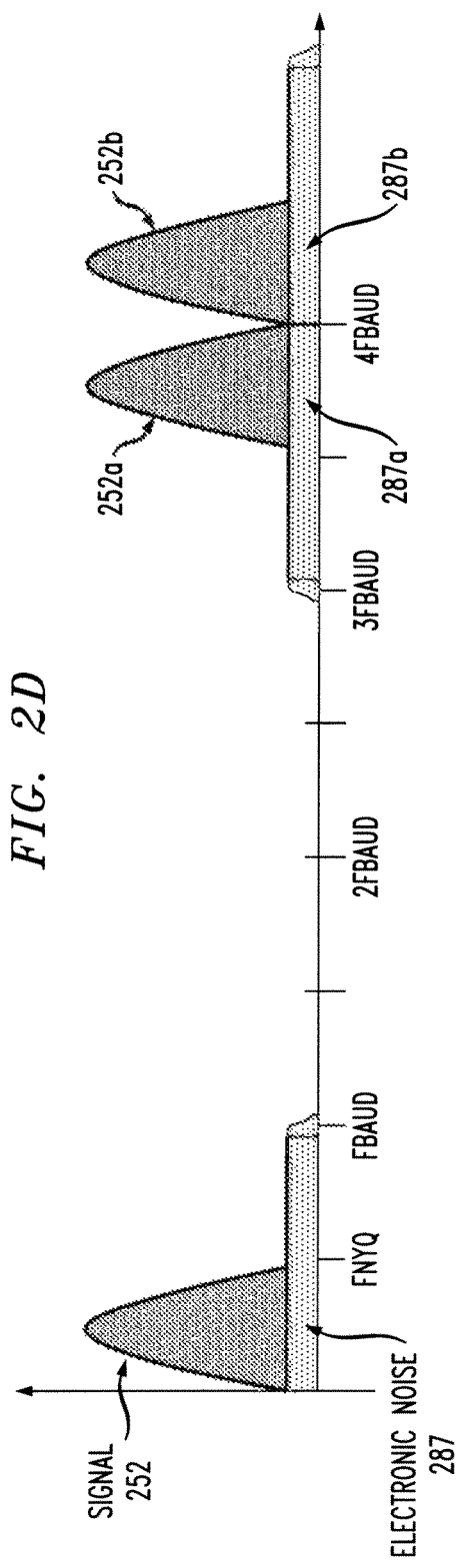
FIG. 2D illustrates the power spectral density of signal and noise at the output of the oversampled ADC of FIG. 2A, as a function of frequency, for an ADC with no quantization noise.

FIG. 2D illustrates the power spectral density of signal 252 and noise 287 at the output of the oversampled ADC 250 of FIG. 2A, as a function of frequency, for an ADC with no quantization noise (i.e., an ideal ADC with infinite precision). Due to oversampling, there are spurious copies 252a, 252b of the signal 252 and noise densities 287a, 287b at four times (4×) the baud rate frequency. As shown in FIG. 2D, the spurious copies 252a, 252b, 287a, 287b are double sided and centered around 4 fbaud since the oversampling ratio is 4 in the exemplary embodiment. It is noted that for a finite precision ADC, ADC quantization noise would also be present.

Figure 2E:
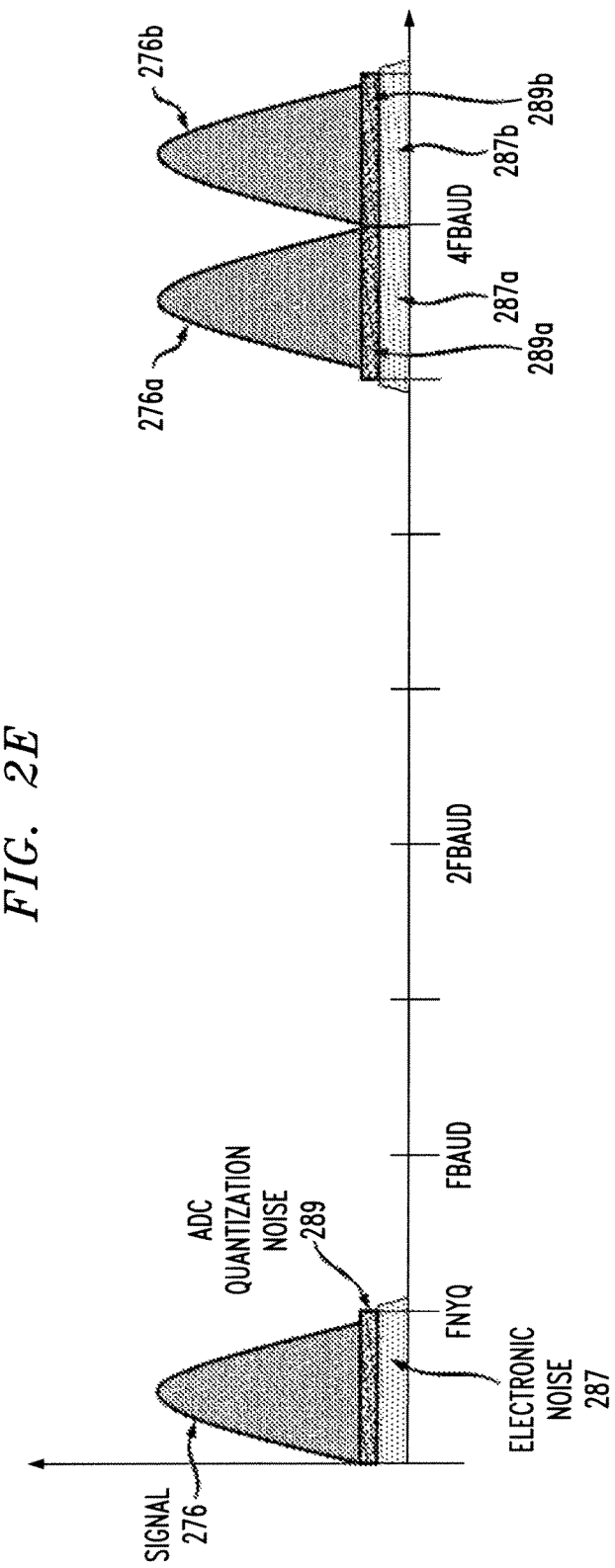
FIGS. 2E and 2F illustrate the power spectral density of signal, noise and ADC quantization noise at the output of the DLPF and downsampler of FIG. 2A, respectively, as a function of frequency.

FIG. 2E illustrates the power spectral density of signal 276, noise 287 and ADC quantization noise 289 at the output of the DLPF 275 of FIG. 2A, as a function of frequency. Due to oversampling, there are spurious copies 276a, 276b of the signal 276; spurious copies 287a, 287b of the noise densities 287; and spurious copies 289a, 289b of the ADC quantization noise 289 at four times (4×) the baud rate frequency, as would be apparent to a person of ordinary skill in the art, although not shown in FIG. 2E for ease of illustration. As shown in FIG. 2E, the spurious copies 276a, 276b, 287a, 287b are double-sided and centered around 4 fbaud since the oversampling ratio is 4 in the exemplary embodiment. Since the DLPF implements a low-pass corner frequency at about the Nyquist frequency, the power spectral densities of signal 276, noise 287 and ADC quantization noise 289 are band limited and non-zero between zero and about fnyq. Also, the spurious copies 276a, 276b, 287a, 287b reflect this band limitation. Additional double-sided spurious copies of signal 276, noise 287 and ADC quantization noise 289 exist at other multiples of 4× the baud rate frequency such as 8× and 16× and these spurious copies are not shown in FIG. 2E.

Figures 2F, 3A:
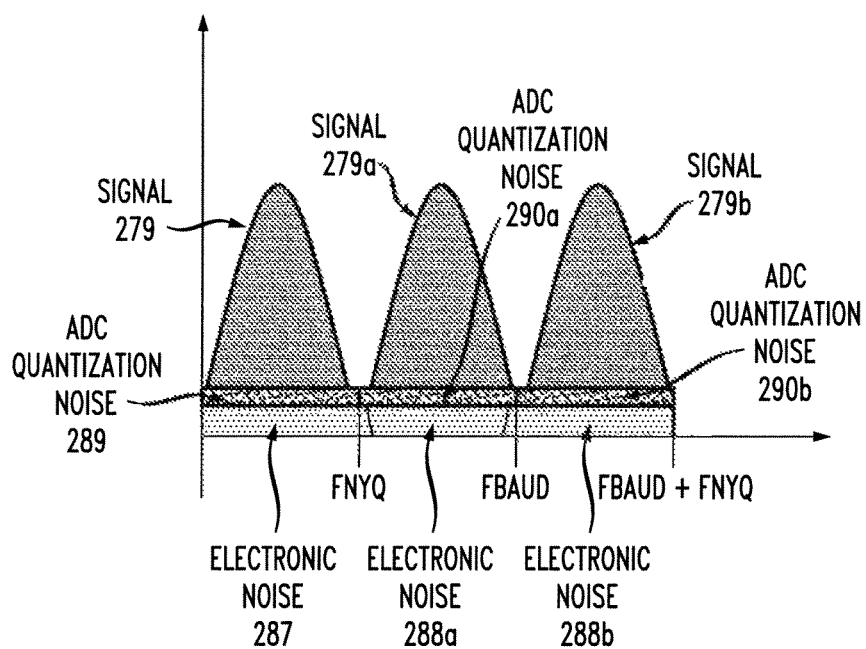
FIGS. 3A and 3B illustrate an exemplary technique for determining the filter coefficients for the DLPF of FIG. 2A.

FIG. 2F illustrates the power spectral density of signal 279, noise 287 and ADC quantization noise 289 at the output of the downsampler 278 of FIG. 2A, as a function of frequency, where the downsampler 278 downsamples the signal (including the noise component) to baud rate. Due to the downsampling to baud rate, there are spurious copies 279a, 279b of the signal 279; spurious copies 288a, 288b of the noise densities 287; and spurious copies 290a, 290b of the ADC quantization noise 289 at various multiples of the baud rate frequency, as would be apparent to a person of ordinary skill in the art, although not shown in FIG. 2F for ease of illustration. As shown in FIG. 2F, the spurious copies 279a, 279b, 288a, 288b, 290a, 290b are double-sided and centered around the baud rate frequency, fbaud. Due to the lowpass filtering with the DLPF prior to downsampling, as discussed above in conjunction with FIG. 2D, the power spectral densities of signal 279, noise 287 and ADC quantization noise 289 are band limited and non-zero between zero and about fnyq. Also, the spurious copies 279a, 279b, 288a, 288b (and all other spurious copies) reflect this band limitation and no aliasing occurs after downsampling as a result.

As indicated above, the exemplary DLPF 275 can perform anti-alias filtering, band-limit filtering of electronic noise (and other noise components) and signal shape filtering to reduce ISI, in accordance with the present invention.

Generally, the anti-alias filtering removes noise and any residual signal components above the Nyquist frequency in order to avoid aliasing at the output of the downsampler 278. The DLPF 275 should therefore have a low pass corner frequency at about the Nyquist frequency, fnyq.

The VGA 220 and/or CTF 225 will perform anti-alias and band-limit filtering to avoid aliasing at the output of oversampled ADC 250, and the DLPF 275 will perform anti-alias and band limit filtering to avoid anti-aliasing at the output of the downsampler 278. The low pass corner frequency of the VGA 220 and/or CTF 225 should be somewhere between the Nyquist frequency and half the oversampling frequency, while the low pass corner frequency of the DLPF 275 should be at around the Nyquist frequency. The present invention recognizes that since, for an oversampled system, the slope of the transfer function of the VGA 220 or CTF 225 at the low pass corner frequency can be less steep compared to a prior art baud rate system without oversampling, the design of the VGA 220 or CTF 225 is less challenging. In general, the higher the oversampling ratio, the less steep the slope needs to be.

In the exemplary embodiment illustrated in FIGS. 2A-2F, the VGA 220 limits noise and unwanted signal components above the baud rate frequency, and the DLPF 275 limits noise and unwanted signal components above the Nyquist frequency.

Optionally, the VGA 220, CTF 225 or DLPF 275 may perform additional signal shape filtering to, for example, equalize the signal in order to remove some or all intersymbol interference.

It is noted that if the VGA 220 implements a low pass filter function with a lowpass corner frequency somewhere between the Nyquist frequency and half the oversampling frequency, the CTF 225 can be omitted.

In further variations, the CTF 225 can perform low-pass filtering to reduce noise above half the sampling frequency of the oversampling ADC 250. In an exemplary implementation, the CTF 225 would implement only poles in the transfer function in order to implement low pass filtering. In another variation, the CTF 225 can optionally perform some pulse shaping or equalization by providing, for example, some high frequency boost. In an exemplary implementation, the CTF 225 would also implement zeros in the transfer function to provide high frequency boost.

As previously indicated, a suitable transfer function, H(s), for the CTF 225 is provided below in the following section entitled "Determining Coefficients for Digital LPF," where the numerator stages indicate the zeros and the denominator indicate the poles.

Determining Coefficients for Digital LPF

As indicated above, the exemplary data detection system 200 includes a DLPF 275. In an exemplary embodiment, the DLPF 275 is implemented as a finite impulse response (FIR) filter. Also, other well-known digital filter structures such as infinite impulse response (IIR) filter can be used. FIGS. 3A and 3B illustrate an exemplary technique for determining the filter coefficients of an FIR implementation of the DLPF 275. The design and implementation of FIR filters can be found, for example, in Keshab K. Parhi, "VLSI Digital Signal Processing Systems: Design and Implementation," (Jan. 4, 1999) or John G. Proakis and Dimitris K. Manolakis, "Digital Signal Processing," (4th Ed., Apr. 7, 2006).

It is again noted that the exemplary DLPF 275 performs one or more filter functions in the digital domain that were previously performed by a CTF in the analog domain in conventional read channels, in accordance with aspects of the present invention. According to another aspect of the invention, the DLPF 275 is programmed using fewer degrees of freedom. To provide adequate filtering capability, a digital filter that replaces at least a portion of a traditional CTF 225 in a read channel needs to have several taps, and also needs to support a wide range of values for each tap coefficient. Thus, it is more difficult to exhaustively optimize the digital filter, compared to optimizing the analog CTF. To help with this, the present invention maps the coefficient space of the DLPF 275 to the digital equivalent of an analog CTF 225 and provides a method to generate the desired filter coefficients.

As discussed hereinafter, the digital DLPF 275 can be optimized using just two degrees of freedom: cutoff and boost, in a similar manner to the conventional analog CTF 225. Generally, the cutoff frequency is the frequency at which the magnitude response of the denominator section of the transfer function is 3 dB below the magnitude response of the denominator section at DC. Likewise, boost is the magnitude response contribution of the numerator section measured at the cutoff frequency. Typically, boost provides for amplification of the input power at high frequencies close to the Nyquist frequency. This provides some equalization of the input signal.

Specifically, the DLPF 275 is programmed to be the bilinear transformed version of the CTF in the conventional baud-rate system. This digital filter is IIR (infinite impulse response) in general. To account for finite precision details, the DLPF 275 is further modified to be in FIR (Finite Impulse Response) form by mapping it to the truncated impulse response of the IIR filter.

In one exemplary implementation, the DLPF 275 is generated using user-specified Cutoff and Boost values. Given the user-specified Cutoff and Boost values, a transfer function, H(s), is constructed for the analog version of the filter, as follows:

$$H(s) = \frac{\frac{s}{a\omega_0}+1}{\frac{s^2}{\omega_0^2}+\frac{s}{1.086\omega_0}+1} \times \frac{-\frac{s}{a\omega_0}+1}{\frac{s^2}{\omega_0^2}+\frac{s}{1.086\omega_0}+1} \times \frac{1}{\frac{s^2}{\omega_0^2}+\frac{s}{0.6031\omega_0}+1}$$

where $\omega_0$ is the filter cutoff frequency; a is a zero location and s is the analog frequency.

Thereafter, the transfer function, H(s), is transformed to a frequency domain characterization, H(z), using an exemplary bilinear transform 300. As shown in FIG. 3A, the exemplary bilinear transform 300 from the continuous time domain to an oversampled digital domain can be expressed as follows:

$$s = \frac{2}{T_d}\left(\frac{1-z^{-1}}{1+z^{-1}}\right).$$

In one exemplary embodiment, the five terms from the exemplary transfer function, H(s) (two first order numerator terms and three second order denominator terms), are each separately applied to the bilinear transform 300 to produce a corresponding set of coefficients for a given stage, i, of a multi-stage IIR filter, as discussed further below in conjunction with FIG. 3B:

$(\alpha^0, \alpha^1, \beta^0, \beta^1)$.

Thus, the exemplary transform output comprises 20 IIR coefficients (four coefficients per stage for the exemplary five stage IIR filter).

In a further variation, the DLPF coefficients can be precomputed for a number of cutoff/boost combinations and stored in a look-up table. Thus, given the user-specified Cutoff and Boost values, the DLPF coefficients can be obtained from the look-up table. In this manner, the coefficients can be more quickly obtained (with a table look-up being faster than circuit computations).

Thus, the DLPF 275 is programmed using cutoff/boost combinations, where the DLPF coefficients are determined based on cutoff and boost either using either a coefficient computation filter or a lookup table. The coefficient computation filter computes the DLPF coefficients based on cutoff and boost as described above, for example, in conjunction with FIGS. 3A and 3B. Alternatively, the DLPF coefficients can be precomputed (using, for example, the described coefficient computation filter or other analytical means) and stored in a lookup table for different cut-off/boost combinations. During normal operation, the DLPF coefficients are then retrieved from the look-up table for a specific cutoff/boost pair. Generally, the look-up table employs cutoff and boost pair values as an input and provides the DLPF coefficients as an output. The cutoff/boost computation filter or the look-up table can be implemented in hardware, for example, in the read channel, or in firmware. A hardware implementation has the additional advantage of being easier to use and allows for faster computation of DLPF coefficients, while a firmware implementation provides flexibility (look-up table or computation filter can be easily changed by reprogramming firmware).

In addition, the bilinear transform 300 or the look-up table can be implemented in hardware, for example, in the data detection system 200, or in firmware. A hardware implementation may be easier to use and may allow for faster computation of the DLPF coefficients, while a firmware implementation provides flexibility (for example, the look-up table or computation filter can be easily changed by reprogramming firmware).

Figure 3B:
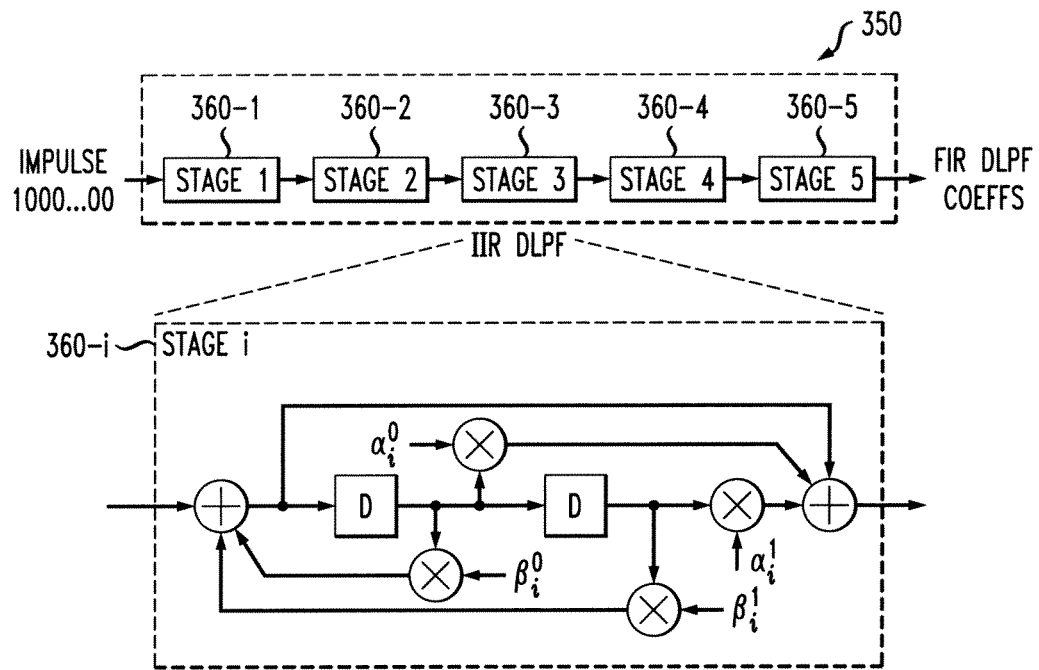

FIG. 3B illustrates an exemplary multi-stage IIR filter 350 that is used to determine the coefficients for the DLPF 275. As shown in FIG. 3B, the exemplary multi-stage IIR filter 350 comprises five stages 360-1 through 360-5. A given stage 360-$i$ is comprised of a number of adders (+), multipliers (×) and delay elements (D), as shown in FIG. 3B. The coefficients generated for each stage by the bilinear transform 300 are applied to a corresponding multiplier (×), as shown in FIG. 3B. An impulse is applied to the input of the five-stage IIR filter 350 and the coefficients for the DLPF 275 are generated at the output of the five-stage IIR filter 350. As indicated above, in one exemplary implementation, the number of coefficients generated at the output of the five-stage IIR filter 350 are truncated to a maximum of 24.

Thus, the exemplary DLPF 275 has 24 filter tap coefficients. In this manner, an aspect of the invention allows the 24 coefficients to be obtained from only two independent variables (cutoff and boost (i.e., zero)), in a similar manner to analog implementations of LPFs. The user can thus optionally specify desired cutoff and boost values for the DLPF 275. Thereafter, the specified cutoff and boost values are used to compute the 24 coefficients that represent a fixed point DLPF 275.

Figure 3C:
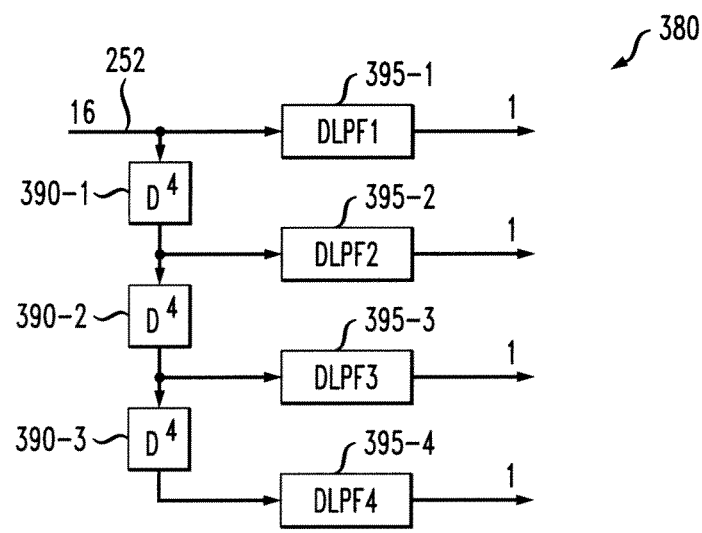
FIG. 3C illustrates an exemplary implementation of an integrated version of the DLPF and downsampler of FIG. 2A.

FIG. 3C illustrates an exemplary alternate implementation of an integrated DLPF and downsampler 380 corresponding to the DLPF 275 and downsampler 278 of FIG. 2A. Generally, the integrated DLPF and downsampler 380 performs downsampling while also performing the additional band-limit filtering of electronic noise, as well as signal shape filtering to reduce ISI, in accordance with the present invention.

The exemplary integrated DLPF and downsampler 380 is shown for an oversampling rate of N=4. It is noted that the exemplary ADC 250 generates four samples per bit duration. For a quarter rate implementation without oversampling, four baud rate samples are processed each 4T period (where T corresponds to one bit period), as opposed to one sample each period for a baud rate implementation without oversampling. The processing rate (throughput) remains one sample per bit duration, but now the samples are processed in parallel. For a quarter rate implementation with an oversampling rate of N=4, the exemplary integrated DLPF and downsampler 380 (at quarter-rate) processes 16 samples per 4T and generates the four samples per 4T that will be kept following the downsampling operation. In other words, the integrated DLPF and downsampler 380 does not generate the additional 12 samples per 4T that will be dropped by the downsampler 278.

As shown in FIG. 3C, the exemplary integrated DLPF and downsampler 380 includes three delay elements 390-1 through 390-3 that each delay the output 252 of the ADC 250 by four samples. In addition, the exemplary integrated DLPF and downsampler 380 comprises four parallel DLPFs 395-1 through 395-4 that each process the four time-delayed versions of the output 252 of the ADC 250. Each parallel DLPF 395 may be implemented as a DLPF having the coefficients generated by the IIR filter 350 of FIG. 3B.

Figure 4:
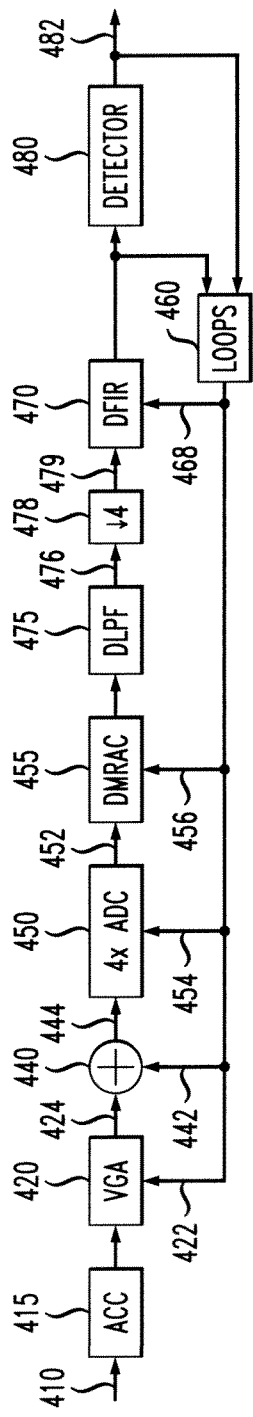
FIG. 4 illustrates an alternate exemplary data detection system incorporating a digital MRA correction filter.

FIG. 4 illustrates an alternate exemplary data detection system 400 incorporating various aspects of the present invention, including a digital MRA correction filter. Generally, the embodiment of FIG. 4 recognizes that the oversampled ADC output allows the MRA correction node to be moved to the DLPF input in the digital domain.

The data detection system 400 includes an analog front end that receives an analog input signal 410 via AC coupling 415, in a similar manner to the data detection systems 100, 200 of FIGS. 1 and 2A. In addition, the output of AC coupling 415 is amplified using a variable gain amplifier 420, governed by a gain feedback value 422 that is provided by a feedback loop 460, in a similar manner to FIG. 1. The amplified input 424 is summed with an offset value 442 using a summation element 440. Offset value 442 is provided by a feedback loop 460, in a similar manner to FIG. 1.

As shown in FIG. 4, the sum 444, representative of analog input signal 410, is provided to an oversampled ADC 450 that converts the continuous analog signal 444 into a plurality (N) of corresponding digital samples 452 for each bit interval, where N can be an integer or non-integer value larger than 1. For example, the oversampling may generate N=2 or N=4 digital samples 452 for each bit interval.

The oversampled digital samples 452 are then processed by a digital MRA correction filter 455, discussed further below in conjunction with FIG. 5B. Generally, the DMRA correction filter 455 is implemented in the oversampled digital domain and approximates the inverse transfer function needed to linearize the output of the read head. The exemplary DMRA correction filter 455 processes oversampled signals. In addition, the feedback loops 460 generate feedback values 456 ($\beta$) for the DMRA correction filter 455, as discussed further below in conjunction with FIG. 5B.

The output of the DMRA correction filter 455 is applied to the DLPF 475, which may be implemented in a similar manner to the DLPF 275 of FIGS. 2A and 3A through 3C. In the embodiment of FIG. 4, however, which does not contain an analog CTF, the DLPF 475 performs anti-aliasing filtering, full band-limit filtering of electronic noise, as well as signal shape filtering to reduce ISI in the digital domain, as discussed above in conjunction with FIGS. 2B through 2F. The DLPF 475 can be implemented using the techniques described above in conjunction with FIGS. 3A and 3B.

In the exemplary embodiment of FIG. 4, the filtered output 476 generated by the DLPF 475 is then downsampled to a baud rate by a downsampling circuit 478. As discussed above in conjunction with FIG. 3C, the DLPF 475 and downsampling circuit 478 can optionally be implemented as a single integrated circuit. The downsampled output 479 generated by the downsampling circuit 478 comprises a single digital sample for each bit interval. The downsampled output 479 is provided to a digital FIR filter 470 that provides a filtered output to a data detector 480, in a similar manner to FIGS. 1 and 2A. Data detector 480, such as a Viterbi algorithm data detector, provides an ideal output 482 that is processed by feedback loops 460. The data detector 480 may be any known data detector circuit. An exemplary data detector 680 is discussed further below in conjunction with FIG. 8.

The feedback loops 460 may comprise, for example, the gain calculation circuit 130, offset circuit 195 and digital phase lock loop circuit 160 of FIG. 1, that generate a gain feedback value 422, an offset value 442 and a clock signal 454, respectively, in a similar manner to FIG. 1. In addition, the feedback loops 460 generate a set of equalizer coefficients 468 for the DFIR 470, as discussed further below in conjunction with FIGS. 9A and 9B.

Figure 5A:
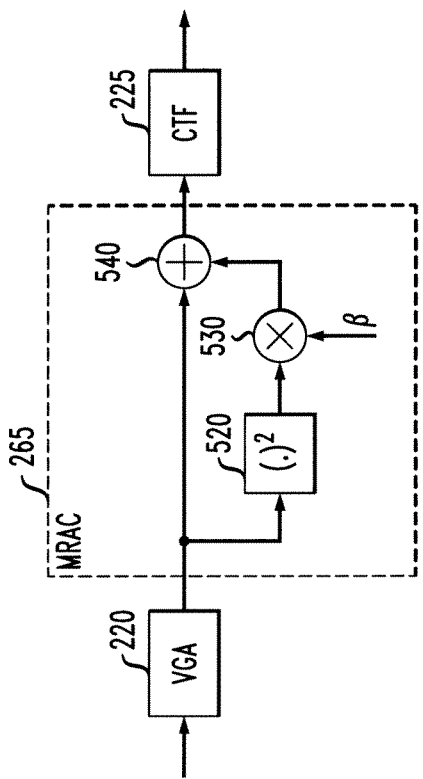
FIGS. 5A and 5B are block diagrams of exemplary analog and digital MRA correction blocks, respectively, of FIGS. 2A and 4, respectively.

FIG. 5A is a block diagram of an exemplary analog MRA correction block 265 (FIG. 2A). As previously indicated, magneto-resistive (MR) heads that are used in magnetic recording systems typically exhibit non-linear transfer functions. Ideally, the output current(s) from the head is linearly related to the magnetic flux being read (x). However, most read heads exhibit quadratic non-linearity, with the result that the output current is expressed as follows:

$$s=kx+\alpha x^2,$$

where k is a scaling factor and a controls the level of non-linearity in the head. This phenomenon is referred to as MR asymmetry (MRA) in the head. In a conventional read channel, the analog portion may have an MRA correction (MRAC) block 265 (FIG. 2A), which approximates the inverse transfer function needed to linearize the output of the read head. In particular, the following equation is the transfer function of an MRAC block that approximates the linearizing transfer function using a quadratic transfer function:

$$y=k_2 s-\beta s^2,$$

where $k_2$ is a scaling factor and the coefficient $\beta$ is chosen to minimize the residual error in the MRAC block output compared to an ideal linear transfer function. As shown in FIG. 5A, the output of the VGA 220 of FIG. 2A is squared by the MRAC 265 at stage 520 and scaled at a multiplier 530 using the correction factor $\beta$ before it is subtracted from the output of VGA 220 by adder 540. This ensures that the input to the continuous-time filter (CTF) 225 is linearized. It is noted that the DC correction performed by the adder 240 of FIG. 2A is omitted from FIG. 5A for ease of illustration.

As indicated above, the present invention recognizes that the MRAC block 265 (FIG. 2) can alternatively be implemented in the digital domain, using samples generated by the analog-to-digital converter (ADC) 450. This leads to the digital MRAC (DMRAC) block 455.

Figure 5B:
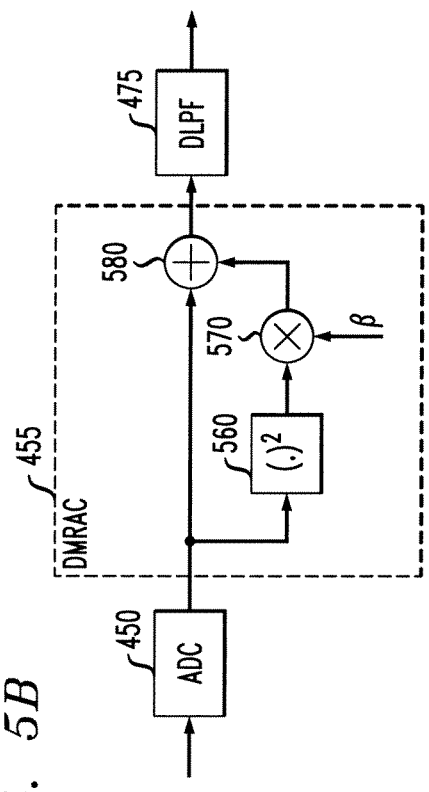

FIG. 5B is a block diagram of an exemplary digital MRA correction block 455 (FIG. 4). This can also be implemented using the quadratic equation used by the analog MRAC block 265 of FIGS. 2A and 5A, but due to filtering in the analog domain before digitization by the ADC 450, it might be beneficial to choose other (linear or non-linear) transfer functions to minimize residual error compared to linear output.

As shown in FIG. 5B, the output samples from the ADC 450 are squared by the DMRAC 455 at stage 560 and scaled at a multiplier 570 using the correction factor $\beta$ before it is subtracted from the output of the ADC 450 by adder 580. This ensures that the input to the DLPF 475 is linearized.

Figure 6:
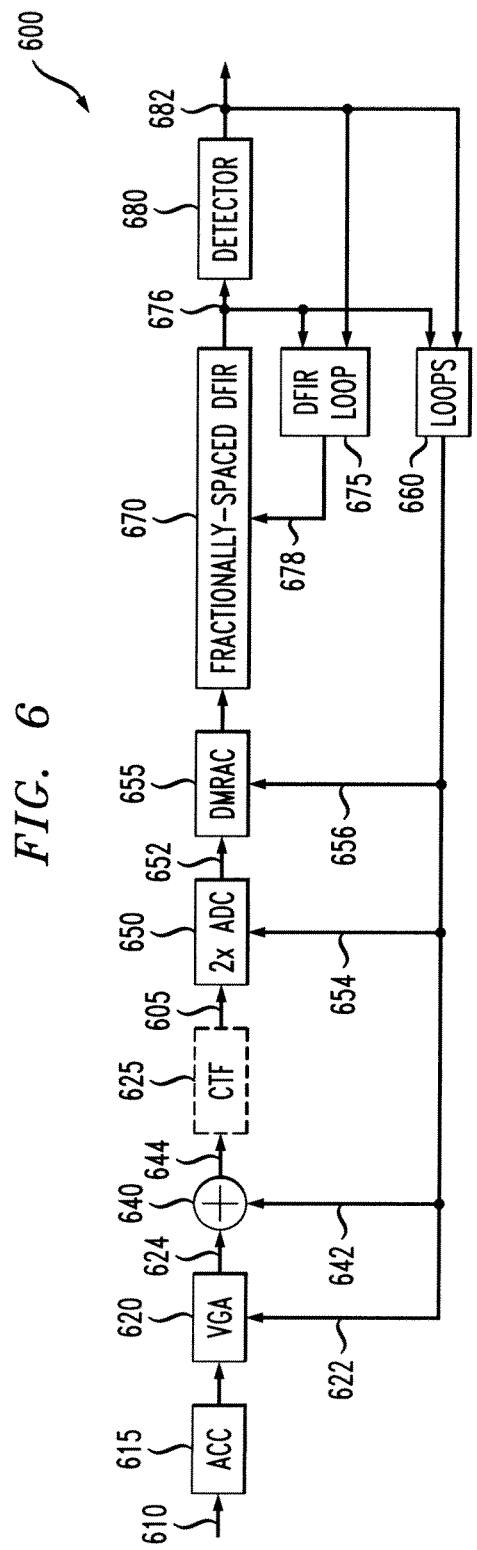
FIG. 6 illustrates an alternate exemplary data detection system incorporating a fractionally spaced digital finite impulse response (DFIR) filter.

FIG. 6 illustrates an alternate exemplary data detection system 600 incorporating various aspects of the present invention, including a fractionally spaced DFIR filter 670. Generally, the fractionally-spaced equalization embodiment of FIG. 6 provides improved performance through the adaptation of the filter coefficients, as discussed further below in conjunction with FIGS. 9A and 9B. In addition, as discussed hereinafter, the fractionally-spaced equalization embodiment of FIG. 6 optionally employs an analog CTF 625 to perform a portion of the total filtering requirement. In the exemplary embodiment, the oversampling rate is N=2, but other oversampling ratios can be chosen, where N is either an integer (for example 4) or non-integer (for example 1.5) larger than 1. The data detection system 600 includes an analog front end that receives an analog input signal 610 via AC coupling 615, in a similar manner to the data detection systems 100, 200, 400 of FIGS. 1, 2A and 4. In addition, the output of AC coupling 615 is amplified using a variable gain amplifier 620, governed by a gain feedback value 622 that is provided by a feedback loop 660, in a similar manner to FIG. 1. The amplified input 624 is summed with an offset value 642 using a summation element 640. Offset value 642 is provided by a feedback loop 660, in a similar manner to FIG. 1.

As shown in FIG. 6, the sum 644 is applied to an optional CTF 625 that may operate to filter undesirable noise from the received analog signal, as discussed above. CTF 625 provides a data input 605 that is representative of analog input signal 610. CTF 625 may be any filter known in the art that is capable of reducing or eliminating noise from a received analog signal. A variety of filters and filter architectures may be used in accordance with different embodiments of the invention, as would be apparent to a person of ordinary skill in the art.

Data input 605 is provided to an oversampled ADC 650. The exemplary oversampled ADC 650 converts the continuous analog signal 605 into a plurality (N) of corresponding digital samples 652 for each bit interval. The exemplary oversampling ADC 650 generates N=2 digital samples 652 for each bit interval. Digital samples 652 are obtained in accordance with a clock signal 654 generated based on the received data, for example, by a digital phase lock loop circuit within loops 660.

The oversampled digital samples 652 are then processed by a digital MRA correction filter 655, discussed above in conjunction with FIG. and 5B. Generally, the DMRA correction filter 655 approximates the inverse transfer function needed to linearize the output of the read head. In addition, the feedback loops 660 generate feedback values 656 ($\beta$) for the DMRA correction filter 655, as discussed above in conjunction with FIG. 5B.

The output of the DMRA correction filter 655 is applied to the fractionally-spaced DFIR 670, which may be implemented as discussed below in conjunction with FIG. 7 or in a similar manner to the integrated DLPF and downsampler 380 of FIG. 3C. Generally, the integrated DLPF and downsampler 380 performs downsampling while also performing the additional band-limit filtering of electronic noise and other noise components, as well as signal shape filtering to reduce ISI, in accordance with the present invention.

Thus, in the exemplary embodiment of FIG. 6, the filtered output 676 generated by the fractionally-spaced DFIR 670 is already downsampled to the baud rate. The filtered output 676 generated by the fractionally-spaced DFIR 670 comprises a single digital sample for each bit interval. The filtered output 676 is provided to a data detector 680, discussed further below in conjunction with FIG. 8. Data detector 680, such as a Viterbi algorithm data detector, provides an ideal output 682 that is processed by feedback loops 660 and 675. The data detector 680 may be any known data detector circuit.

The feedback loops 660 may comprise, for example, the gain calculation circuit 130, offset circuit 195 and digital phase lock loop circuit 160 of FIG. 1, that generate a gain feedback value 622, an offset value 642 and a clock signal 654, respectively, in a similar manner to FIG. 1. Feedback loop 675 generates a set of equalizer coefficients 678 for the fractionally-spaced DFIR 670, as discussed further below in conjunction with FIGS. 9A and 9B.

It is noted that the fractionally spaced DFIR 670 is oversampled as well, thereby potentially improving the error rate performance (not just because the coefficients are adapted, but also due to oversampling, which can help to make error rate performance more robust and independent from sampling errors of the oversampling ADC).

Figure 7:
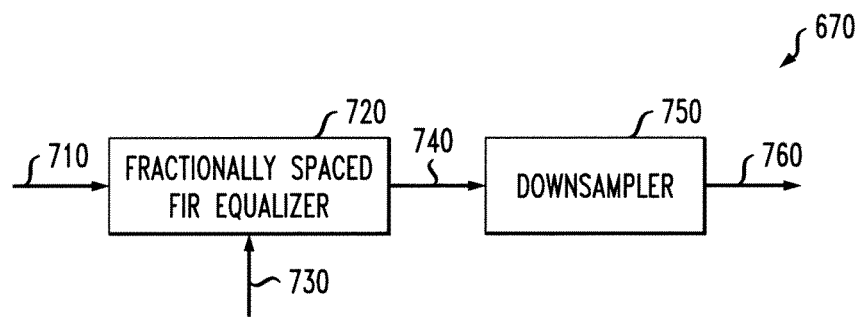
FIG. 7 is a block diagram of an exemplary fractionally spaced DFIR equalizer of FIG. 6.

FIG. 7 is a block diagram of an exemplary fractionally spaced FIR equalizer 670 incorporating features of the present invention. As shown in FIG. 7, the exemplary fractionally spaced FIR equalizer 670 processes an input 710 from the ADC 650 or optional DMRA correction filter 655 of FIG. 6 in the oversampled domain. The exemplary fractionally spaced FIR equalizer 720 generates an FIR output 740 in the oversampled domain as an intermediate output based on equalizer coefficients 730 (fixed or adaptive), and finally, generates FIR output samples 760 in the baud rate domain using a downsampler 750. As indicated above, the exemplary fractionally spaced FIR equalizer 670 may alternatively be implemented in a similar manner to the integrated DLPF and downsampler 380 of FIG. 3C as a single block that outputs samples from the fractionally spaced FIR filter 670 at baud-rate instants.

The purpose of the fractionally spaced FIR filter 670 is to (i) equalize the signal; (ii) shape the signal to a partial response target signal; or (iii) remove some or all of the intersymbol interference (such as precursor inter symbol interference). The fractionally spaced FIR filter 670 is referred to as fractional since the spacing between input samples is fractional due to the oversampling (for example, the spacing is 0.5T for an oversampling ratio of 2).

Figure 8:
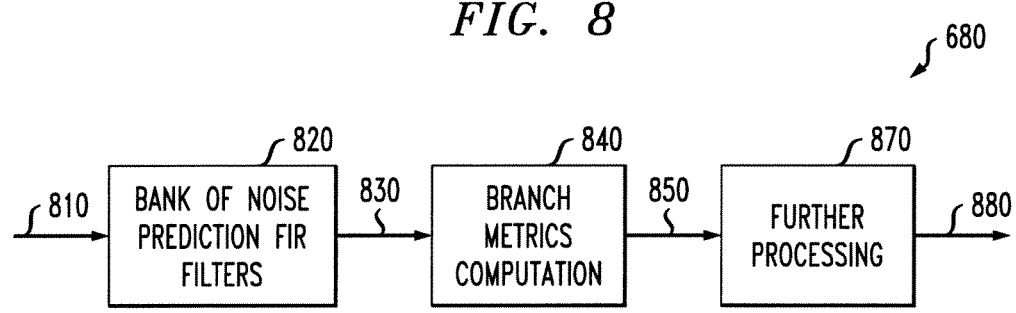
FIG. 8 is a block diagram of an exemplary detector that may be used in conjunction with the exemplary fractionally spaced DFIR equalizer of FIG. 7 in the exemplary data detection system of FIG. 6.

FIG. 8 is a block diagram of an exemplary detector 680 that may be used in conjunction with the exemplary fractionally spaced FIR equalizer 670 of FIG. 7 in the exemplary data detection system 600 of FIG. 6. It is noted that the exemplary detector 680 may also be used to implement the data detectors 280, 480 and 1080 of FIGS. 2, 4 and 10, respectively. As shown in FIG. 8, the exemplary detector 680 processes an input 810 comprised of the downsampled filtered output 676 from the fractionally spaced FIR equalizer 670. The exemplary detector 680 employs a bank of noise prediction FIR filters 820 to provide data-dependent equalization of FIR output samples in the baud-rate domain. The output 830 from this bank of filters 820 is processed by a branch metrics computation unit 840 to generate branch metrics 850, which are used for further processing at stage 870, in a known manner, to generate decisions and/or soft information as output 880. For a discussion of suitable noise prediction FIR filters 820 and branch metrics computation unit 840, see, for example, United States Published Application No. 2005/0249273, filed May 5, 2004, entitled "Method and Apparatus for Generating Filter Tap Weights and Biases for Signal Dependent Branch Metric Computation," incorporated by reference herein.

As previously indicated, the feedback loop 675 of FIG. 6 generate a set of equalizer coefficients 678 for the fractionally-spaced DFIR 670. FIGS. 9A and 9B illustrate exemplary techniques for adapting the set of equalizer coefficients 678. Generally, as discussed further below in conjunction with FIGS. 9A and 9B, adaptation algorithms for oversampled equalization are similar to those used for baud-rate equalization. For a baud-rate system, let $\{x_k\}$ be the input sequence to a length-M finite impulse response (FIR) filter with coefficients $\{f_n\}_{n=0}^{M-1}$, and let $\{y_k\}$ be the desired sequence at the FIR filter output, based on the equalization target and the decision sequence (either from the detector or based on a priori information). The equalization error at time kT is $e_k = y_k - d_k$.

Figure 9A:
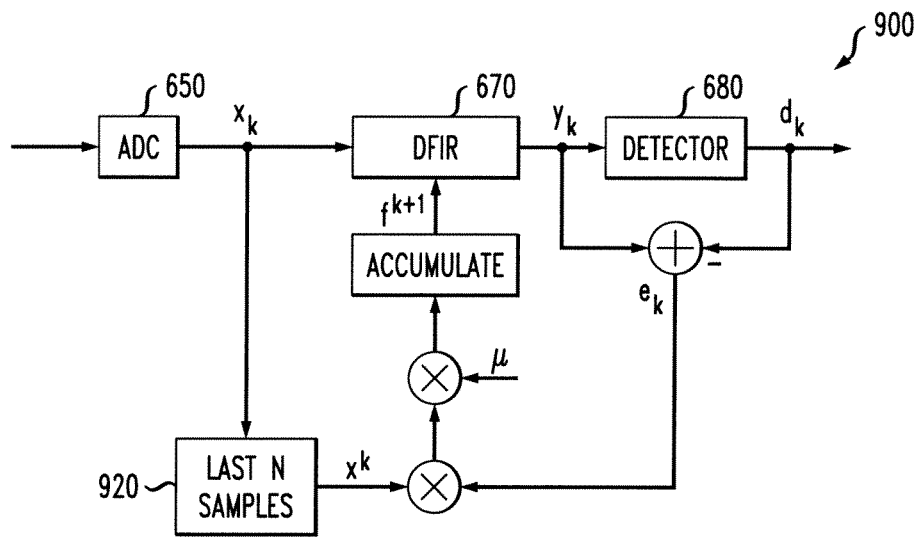
FIGS. 9A and 9B illustrate an exemplary least mean squares (LMS) adaptation algorithm and an exemplary zero-forcing (ZF) algorithm, respectively.

FIG. 9A illustrates an exemplary least mean squares (LMS) adaptation algorithm 900. Generally, the exemplary LMS adaptation algorithm 900 adapts the equalization coefficients as follows: $f^{k+1} = f^k - \mu e_k x^k$, where $\mu$ controls adaptation speed, $f^k$ is the vector of equalizer coefficients at time k and $x^k$ is a vector of the most recent N FIR inputs.

Instead of collecting one sample every T as with the conventional baud rate system, the exemplary oversampled least mean squares (LMS) adaptation algorithm 900 collects N samples every baud rate interval, corresponding to an oversampling rate of N. For the oversampled system, let $\{x_k\}$, the output from ADC 650, be the input sequence to the length-M finite impulse response (FIR) filter 670 with coefficients $\{f_n\}_{n=0}^{M-1}$, and let $\{y_k\}$ be the output sequence from filter 670. The FIR filter 670 with M coefficients now spans MT/N instead of MT as with the baud-rate system. Let $\{d_k\}$, the output of detector 680, be the desired baud-rate sequence at the FIR filter output, as before. It is noted that the oversampled digital samples can be available in the feedback loop. Thus, the LMS adaptation algorithm 900 can compute coefficients at the oversampled rate or at the baud rate. If the LMS adaptation algorithm 900 computes coefficients at the baud rate, the generated coefficient per bit interval is repeated N times to provide equalization coefficients at the oversampled rate.

Figure 9B:
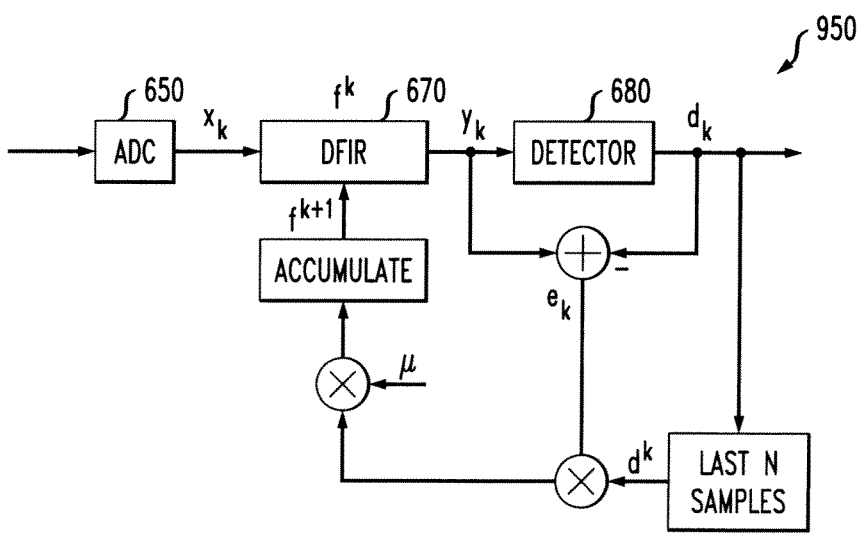

FIG. 9B illustrates an exemplary zero-forcing (ZF) algorithm 950. Generally, the exemplary ZF algorithm 950 adapts the equalization coefficients differently as follows: $f^{k+1} = f^k - \mu e_k d^k$. For the oversampled system, let $\{x_k\}$, the output from ADC 650, be the input sequence to the length-M finite impulse response (FIR) filter 670 with coefficients $\{f_n\}_{n=0}^{M-1}$, and let $\{y_k\}$ be the output sequence from filter 670. The FIR filter 670 with M coefficients now spans MT/N instead of MT as with the baud-rate system. Let $\{d_k\}$, the output of detector 680, be the desired baud-rate sequence at the FIR filter output, as before. It is noted that in the embodiment of FIG. 9B, the DFIR adaptation loop operates at the baud rate. Thus, the exemplary ZF algorithm 950 generates a single equalization coefficient per bit interval and the generated coefficient is repeated N times to provide equalization coefficients at the oversampled rate.

In one implementation, the error terms, $e_k$, are computed based on output of the oversampled filter at baud-rate intervals, with the result that the update equations are applied every T even with the oversampled system. This is useful when the output of the oversampled system is down-sampled to baud rate before being processed further in the detector and decoder.

In another implementation, the error terms, $e_k$, are computed every T/N. To do this, the baud-rate desired sequence $\{d_k\}$ must be interpolated to generate desired values corresponding to the sub-baud-rate sampling instants. The error terms, $e_k$, are then generated using the interpolated desired values and used in the LMS equation every T/N. For the ZF case, the interpolated desired values are also used in the update equation in place of $d_k$. The second exemplary implementation is desired when the output of the FIR filter 670 in the oversampled domain is processed in the detector 680 without down-sampling. Including error terms corresponding to the sub-baud-rate instants in the update equation ensures that the entire oversampled domain sequence shows desired equalization properties, as opposed to the first implementation, which enforces equalization constraints only on samples at baud-rate instants.

Figure 10:
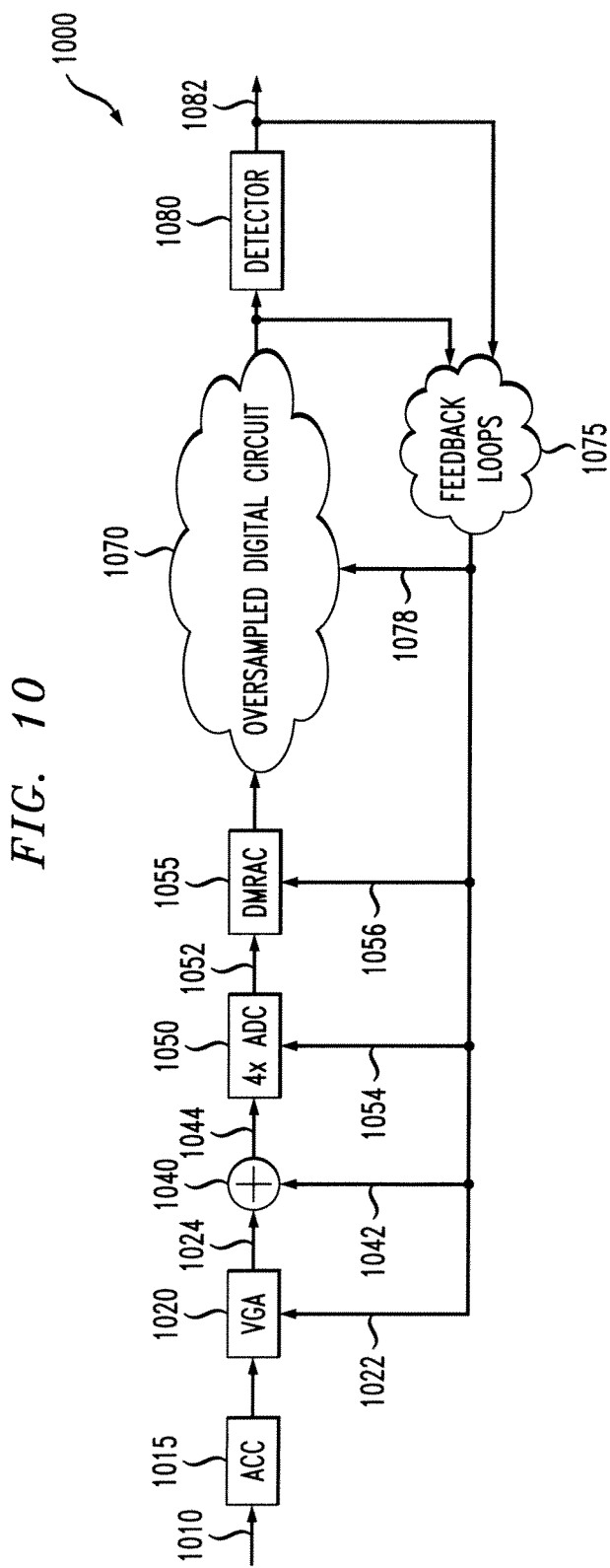
FIG. 10 illustrates an alternate exemplary data detection system incorporating full oversampling for all elements of the data detection system and fractional equalization.

FIG. 10 illustrates an alternate exemplary data detection system 1000 incorporating various aspects of the present invention, including full oversampling for all elements of the data detection system 1000 and fractional equalization.

The data detection system 1000 includes an analog front end that receives an analog input signal 1010 via AC coupling 1015, in a similar manner to the data detection systems 100, 200 of FIGS. 1 and 2A. In addition, the output of AC coupling 1015 is amplified using a variable gain amplifier 1020, governed by a gain feedback value 1022 that is provided by a feedback loop 1075, in a similar manner to FIG. 4. The amplified input 1024 is summed with an offset value 1042 using a summation element 1040. Offset value 1042 is provided by a feedback loop 1075, in a similar manner to FIG. 4.

As shown in FIG. 10, the sum 1044, representative of analog input signal 1010, is provided to an oversampled ADC 1050 that converts the continuous analog signal 1044 into a plurality (N) of corresponding digital samples 1052 for each bit interval. The exemplary oversampling generates N=4 digital samples 1052 for each bit interval. Digital samples 1052 are obtained in accordance with a clock signal 1054 generated based on the received data, for example, by a digital phase lock loop circuit within loops 1075.

The oversampled digital samples 1052 are then processed by a digital MRA correction filter 1055, discussed above in conjunction with FIGS. 5A and 5B. Generally, the DMRA correction filter 1055 approximates the inverse transfer function needed to linearize the output of the read head. In addition, the feedback loops 1075 generate feedback values 1056 ($\beta$) for the DMRA correction filter 1055, in a similar manner to the discussion above in conjunction with FIG. 5B.

The output of the DMRA correction filter 1055 is applied to an oversampled digital circuit 1070. Generally, the exemplary oversampled digital circuit 1070 performs timing adjustment, gain correction, baseline correction (BLC), DC offset correction and equalization. The timing adjustment; gain correction; and baseline correction (BLC) and DC offset correction can be performed by the oversampled digital circuit 1070 at the oversampled rate, N, by performing each function, as described above in conjunction with FIG. 2A, for example, using N parallel branches. In the embodiment of FIG. 10, which does not contain an analog CTF, the oversampled digital circuit 1070 performs equalization at the oversampled rate in the digital domain, such as anti-aliasing filtering, full band-limit filtering, and signal shape filtering, as discussed above, for example in conjunction with FIG. 4.

Data detector 1080, such as a Viterbi algorithm data detector, operates at an oversampled rate and provides an ideal output 1082 that is processed by feedback loops 1075. An exemplary data detector 680 is discussed above in conjunction with FIG. 8. Feedback loops 1075 operate at an oversampled rate to generate a gain feedback value 1022, an offset value 1042 and a clock signal 1054. In addition, the feedback loops 1075 generate a set of equalizer coefficients 1078 for the oversampled digital circuit 1070.

In a further variation, the oversampled digital circuit 1070 could downsample the signal to the baud rate at its output, and the detector 1080 could process the signals at the baud rate.

Figure 11:
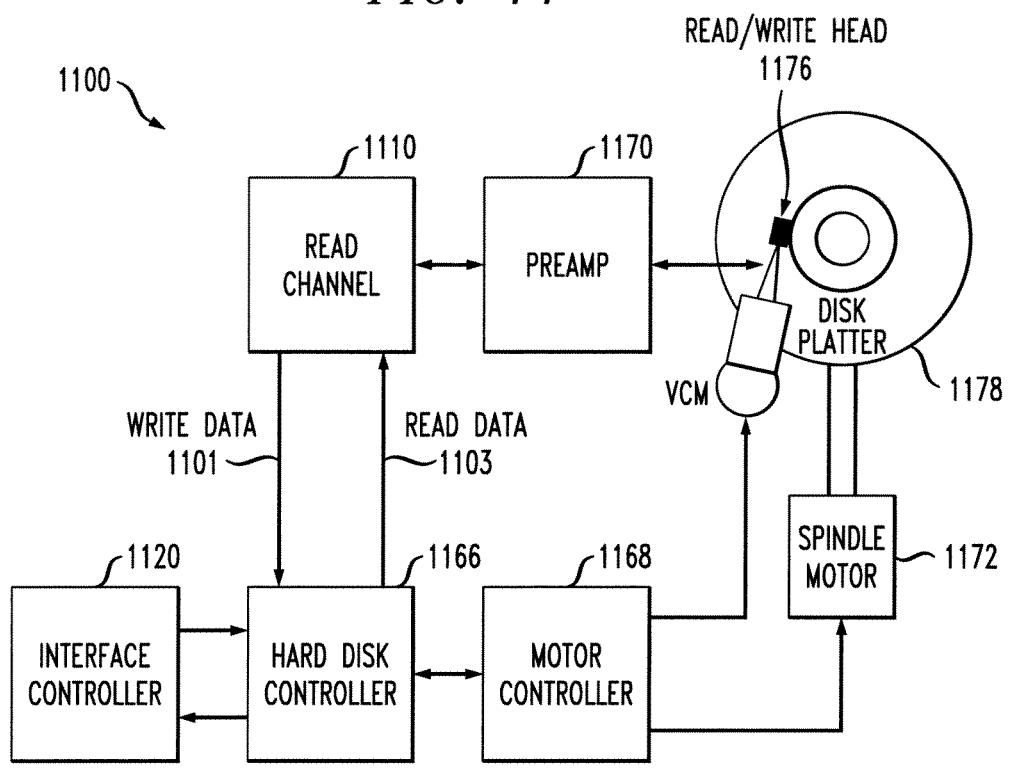
FIG. 11 illustrates a storage system in accordance with various embodiments of the present invention.

FIG. 11 illustrates a storage system 1100 in accordance with various embodiments of the present invention. Storage system 1100 may be, for example, a hard disk drive. Storage system 1100 includes a read channel 1110. In addition, storage system 1100 includes an interface controller 1120, a preamp 1170, a hard disk controller 1166, a motor controller 1168, a spindle motor 1172, a disk platter 1178, and a read/write head 1176. Interface controller 1120 controls addressing and timing of data to/from disk platter 1178. The data on disk platter 1178 consists of groups of magnetic signals that may be detected by read/write head assembly 1176 when the assembly is properly positioned over disk platter 1178. In a typical read operation, read/write head assembly 1176 is accurately positioned by motor controller 1168 over a desired data track on disk platter 1178. Motor controller 1168 both positions read/write head assembly 1176 in relation to disk platter 1178 and drives spindle motor 1172 by moving read/write head assembly to the proper data track on disk platter 1178 under the direction of hard disk controller 1166. Spindle motor 1172 spins disk platter 1178 at a determined spin rate (RPMs).

Once read/write head assembly 1178 is positioned adjacent the proper data track, magnetic signals representing data on disk platter 1178 are sensed by read/write head assembly 1176 as disk platter 1178 is rotated by spindle motor 1172. The sensed magnetic signals are provided as a continuous, minute analog signal representative of the magnetic data on disk platter 1178. This minute analog signal is transferred from read/write head assembly 1176 to read channel module 1110 via preamp 1170. Preamp 1170 is operable to amplify the minute analog signals accessed from disk platter 1178. In addition, preamp 1170 is operable to amplify data from read channel module 1110 that is destined to be written to disk platter 1178. In turn, read channel module 1110 decodes and digitizes the received analog signal to recreate the information originally written to disk platter 1178. This data is provided as read data 1103 from the read channel module 1110 to the hard disk controller 1166, and in turn, to a receiving circuit. A write operation is substantially the opposite of the preceding read operation with write data 1101 being provided from the hard disk controller 1166 to the read channel module 1110. This data is then encoded and written to disk platter 1178.

Figure 12:
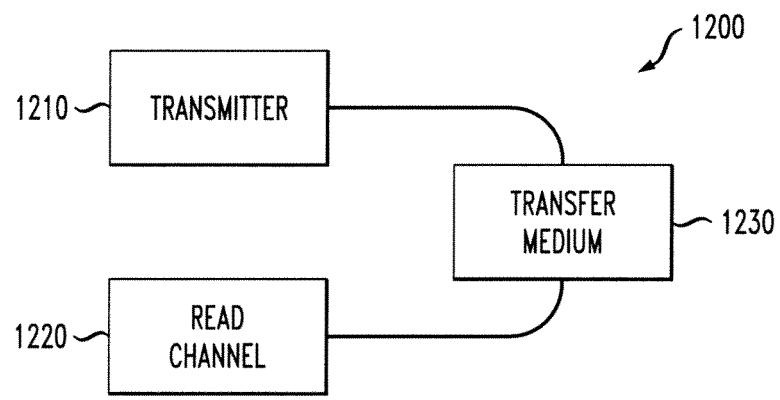
FIG. 12 illustrates a communication system including a receiver in accordance with one or more embodiments of the present invention.

FIG. 12 illustrates a communication system 1200 including a receiver 1220 in accordance with one or more embodiments of the present invention. Communication system 1200 includes a transmitter that is operable to transmit encoded information via a transfer medium 1230 as is known in the art. The encoded data is received from transfer medium 1230 by receiver 1220.

As previously indicated, the oversampled ADC of the present invention allows the CTF circuit to be simplified or eliminated by transferring at least a portion of the filtering and/or equalization processes to the digital domain. For example, (i) anti-alias and/or band limit filtering to reduce out-of-band noise and (ii) pulse shape filtering to compensate for intersymbol interference can now be performed in the digital domain.

In addition, the oversampled ADC of the present invention allows an optional magneto-resist asymmetric (MRA) correction filter to be implemented in the analog domain, for example, prior to an optional CTF 225, as shown in FIGS. 2A and 5A, or in the digital domain, for example, after the ADC, as shown in FIGS. 4 and 5B.

In other exemplary variations, the DLPF and downsampling devices described herein can either be implemented as separate and distinct circuits, as shown in FIG. 2A, or as an integrated device, as shown in FIG. 3C.

In one example, the disclosed methods and apparatus may be used in the storage system of FIG. 11 or the communication system of FIG. 12.

As previously indicated, the arrangements of data detection systems and read channels, as described herein, provide a number of advantages relative to conventional arrangements. As indicated above, the disclosed techniques for implementing a read channel having an oversampled ADC allows at least a portion of the equalization, anti-alias filtering and/or noise band limit filtering processes to be performed in the digital domain, which relaxes the design difficulty of the analog CTF circuit. Also, since the area of digital circuits reduces proportionally with shrinking process geometries, while the area of analog circuits does not reduce as significantly, the disclosed techniques for moving some of the analog signal processing functions into the digital domain will help to design integrated circuits and chips with less area compared to conventional techniques, especially at future process geometries.

Again, it should be emphasized that the above-described embodiments of the invention are intended to be illustrative only. In general, the exemplary data detection systems can be modified, as would be apparent to a person of ordinary skill in the art, to incorporate an oversampled ADC and allow at least a portion of the equalization process or other filtering to be performed in the digital domain. In addition, the disclosed techniques for generating a plurality of digital samples per bit interval can be employed in any data detection system or read channel.

While exemplary embodiments of the present invention have been described with respect to digital logic blocks, as would be apparent to one skilled in the art, various functions may be implemented in the digital domain as processing steps in a software program, in hardware by circuit elements or state machines, or in combination of both software and hardware. Such software may be employed in, for example, a digital signal processor, application specific integrated circuit, micro-controller, or general-purpose computer. Such hardware and software may be embodied within circuits implemented within an integrated circuit.

In an integrated circuit implementation of the invention, multiple integrated circuit dies are typically formed in a repeated pattern on a surface of a wafer. Each such die may include a device as described herein, and may include other structures or circuits. The dies are cut or diced from the wafer, then packaged as integrated circuits. One skilled in the art would know how to dice wafers and package dies to produce packaged integrated circuits. Integrated circuits so manufactured are considered part of this invention.

Thus, the functions of the present invention can be embodied in the form of methods and apparatuses for practicing those methods. One or more aspects of the present invention can be embodied in the form of program code, for example, whether stored in a storage medium, loaded into and/or executed by a machine, or transmitted over some transmission medium, wherein, when the program code is loaded into and executed by a machine, such as a computer, the machine becomes an apparatus for practicing the invention. When implemented on a general-purpose processor, the program code segments combine with the processor to provide a device that operates analogously to specific logic circuits. The invention can also be implemented in one or more of an integrated circuit, a digital signal processor, a microprocessor, and a micro-controller.

It is to be understood that the embodiments and variations shown and described herein are merely illustrative of the principles of this invention and that various modifications may be implemented by those skilled in the art without departing from the scope and spirit of the invention.

We claim:

1. A method for determining one or more coefficients for a digital low pass filter, comprising:

obtaining cutoff and boost values for a corresponding analog version of said digital low pass filter; and determining said one or more coefficients for said digital low pass filter based on said obtained cutoff and boost values for said corresponding analog version of said digital low pass filter.

2. The method of claim 1, wherein said determining step further comprises the steps of:

generating a transfer function, H(s), for said corresponding analog version using said obtained cutoff and boost values:

transforming said transfer function, H(s), to a frequency domain characterization, H(z), using one or more bilinear transforms to obtain a plurality of coefficients for an infinite impulse response (IIR) filter;

generating said IIR filter using said plurality of coefficients for said IIR filter; and applying an impulse to said IIR filter to obtain said one or more coefficients for said digital low pass filter.

3. The method of claim 2, wherein said applying step further comprises the step of truncating a number of said obtained one or more coefficients for said digital low pass filter to a maximum value.

4. The method of claim 2, wherein said transfer function, H(s), comprises:

$$H(s) = \frac{\frac{s}{a\omega_0}+1}{\frac{s^2}{\omega_0^2}+\frac{s}{1.086\omega_0}+1} \times \frac{-\frac{s}{a\omega_0}+1}{\frac{s^2}{\omega_0^2}+\frac{s}{1.086\omega_0}+1} \times \frac{1}{\frac{s^2}{\omega_0^2}+\frac{s}{0.6031\omega_0}+1}$$

where $\omega_0$ is the filter cutoff frequency; a is a zero location and s is the analog frequency.

5. The method of claim 2, wherein at least one of said one or more bilinear transforms comprises:

$$s = \frac{2}{T_d}\left(\frac{1-z^{-1}}{1+z^{-1}}\right).$$

6. The method of claim 2, wherein said IIR filter comprises a plurality of stages.

7. The method of claim 2, wherein said transfer function, H(s), comprises a plurality of terms and wherein each of said plurality of terms is applied to one of said bilinear transforms.

8. The method of claim 7, wherein said IIR filter comprises a plurality of stages and wherein an output of one of said bilinear transforms comprises a plurality of coefficients for one stage of said plurality of stages.

9. The method of claim 1, wherein said determining step further comprises the step of obtaining said one or more coefficients for said digital low pass filter from a look-up table.

10. The method of claim 9, wherein said look-up table is generated using the steps of claim 2.

11. The method of claim 1, wherein said method is implemented using one or more of hardware and firmware.

12. The method of claim 1, wherein said digital low pass filter performs one or more filter functions in a digital domain that were previously performed in an analog domain by said corresponding analog version of said digital low pass filter.

13. The method of claim 1, wherein said digital low pass filter is employed in a read channel.

14. The method of claim 1, wherein said digital low pass filter performs one or more functions of a continuous time filter of a read channel.

15. An apparatus for determining one or more coefficients for a digital low pass filter, comprising:

a memory; and at least one hardware device, coupled to the memory, operative to:

obtain cutoff and boost values for a corresponding analog version of said digital low pass filter; and determine said one or more coefficients for said digital low pass filter based on said obtained cutoff and boost values for said corresponding analog version of said digital low pass filter.

16. The apparatus of claim 15, wherein said at least one hardware device is further configured to determine said one or more coefficients by:

generating a transfer function, H(s), for said corresponding analog version using said obtained cutoff and boost values:

transforming said transfer function, H(s), to a frequency domain characterization, H(z), using one or more bilinear transforms to obtain a plurality of coefficients for an infinite impulse response (IIR) filter;

generating said IIR filter using said plurality of coefficients for said IIR filter; and applying an impulse to said IIR filter to obtain said one or more coefficients for said digital low pass filter.

17. The apparatus of claim 16, wherein said application of said impulse to said IIR filter further comprises truncating a number of said obtained one or more coefficients for said digital low pass filter to a maximum value.

18. The apparatus of claim 16, wherein said transfer function, H(s), comprises:

$$H(s) = \frac{\frac{s}{a\omega_0}+1}{\frac{s^2}{\omega_0^2}+\frac{s}{1.086\omega_0}+1} \times \frac{-\frac{s}{a\omega_0}+1}{\frac{s^2}{\omega_0^2}+\frac{s}{1.086\omega_0}+1} \times \frac{1}{\frac{s^2}{\omega_0^2}+\frac{s}{0.6031\omega_0}+1}$$

where $\omega_0$ is the filter cutoff frequency; a is a zero location and s is the analog frequency.

19. The apparatus of claim 16, wherein at least one of said one or more bilinear transforms comprises:

$$s = \frac{2}{T_d}\left(\frac{1-z^{-1}}{1+z^{-1}}\right).$$

20. The apparatus of claim 16, wherein said IIR filter comprises a plurality of stages.

21. The apparatus of claim 16, wherein said transfer function, H(s), comprises a plurality of terms and wherein each of said plurality of terms is applied to one of said bilinear transforms.

22. The apparatus of claim 15, wherein said digital low pass filter performs one or more filter functions in a digital domain that were previously performed in an analog domain by said corresponding analog version of said digital low pass filter.

23. The apparatus of claim 15, wherein said digital low pass filter is employed in a read channel.

24. The apparatus of claim 15, wherein said digital low pass filter performs one or more functions of a continuous time filter of a read channel.

25. The apparatus of claim 15, wherein said at least one hardware device determines said one or more coefficients for said digital low pass filter by obtaining said one or more coefficients from a look-up table.

26. The apparatus of claim 15, wherein said at least one hardware device comprises one or more of hardware and firmware.

27. An article of manufacture for determining one or more coefficients for a digital low pass filter, comprising a tangible machine readable recordable medium containing one or more programs which when executed implement the steps of:
  obtaining cutoff and boost values for a corresponding analog version of said digital low pass filter; and
  determining said one or more coefficients for said digital low pass filter based on said obtained cutoff and boost values for said corresponding analog version of said digital low pass filter.

28. The article of manufacture of claim 27, wherein said determining step further comprises the steps of:
  generating a transfer function, H(s), for said corresponding analog version using said obtained cutoff and boost values:
  transforming said transfer function, H(s), to a frequency domain characterization, H(z), using one or more bilinear transforms to obtain a plurality of coefficients for an infinite impulse response (IIR) filter;
  generating said IIR filter using said plurality of coefficients for said IIR filter; and
  applying an impulse to said IIR filter to obtain said one or more coefficients for said digital low pass filter.

29. The article of manufacture of claim 27, wherein said determining step further comprises the step of obtaining said one or more coefficients for said digital low pass filter from a look-up table.

\* \* \* \* \*